US006545906B1

(12) United States Patent
Savtchenko et al.

(10) Patent No.: US 6,545,906 B1
(45) Date of Patent: Apr. 8, 2003

(54) METHOD OF WRITING TO SCALABLE MAGNETORESISTANCE RANDOM ACCESS MEMORY ELEMENT

(75) Inventors: Leonid Savtchenko, deceased, late of Chandler, AZ (US), by Anatoli A. Korkin, legal representative; Bradley N. Engel, Chandler, AZ (US); Nicholas D. Rizzo, Gilbert, AZ (US); Mark F. Deherrera, Tempe, AZ (US); Jason Allen Janesky, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/978,859

(22) Filed: Oct. 16, 2001

(51) Int. Cl.[7] ............................................... G11C 11/00
(52) U.S. Cl. ........................ 365/158; 365/171; 365/173
(58) Field of Search ................................ 365/48, 50, 55, 365/158, 171, 173, 180

(56) References Cited

U.S. PATENT DOCUMENTS

| 5,953,248 | A | * | 9/1999 | Chen et al. | 365/158 |
| 6,169,689 | B1 | * | 1/2001 | Naji | 365/173 |
| 6,363,007 | B1 | * | 3/2002 | Lu et al. | 365/158 |

* cited by examiner

*Primary Examiner*—Vanthu Nguyen
(74) *Attorney, Agent, or Firm*—William E. Koch

(57) ABSTRACT

A method to switch a scalable magnetoresistive memory cell including the steps of providing a magnetoresistive memory device sandwiched between a word line and a digit line so that current waveforms can be applied to the word and digit lines at various times to cause a magnetic field flux to rotate the effective magnetic moment vector of the device by approximately 180°. The magnetoresistive memory device includes N ferromagnetic layers that are anti-ferromagnetically coupled. N can be adjusted to change the magnetic switching volume of the device.

31 Claims, 5 Drawing Sheets

METHOD OF WRITING TO SCALABLE MAGNETORESISTANCE RANDOM ACCESS MEMORY ELEMENT

FIELD OF THE INVENTION

This invention relates to semiconductor memory devices.

More particularly, the present invention relates to semiconductor random access memory devices that utilize a magnetic field.

BACKGROUND OF THE INVENTION

Non-volatile memory devices are an extremely important component in electronic systems. FLASH is the major non-volatile memory device in use today. Typical non-volatile memory devices use charges trapped in a floating oxide layer to store information. Disadvantages of FLASH memory include high voltage requirements and slow program and erase times. Also, FLASH memory has a poor write endurance of $10^4$–$10^6$ cycles before memory failure. In addition, to maintain reasonable data retention, the scaling of the gate oxide is restricted by the tunneling barrier seen by the electrons. Hence, FLASH memory is limited in the dimensions to which it can be scaled.

To overcome these shortcomings, magnetic memory devices are being evaluated. One such device is magnetoresistive RAM (hereinafter referred to as "MRAM"). To be commercially practical, however, MRAM must have comparable memory density to current memory technologies, be scalable for future generations, operate at low voltages, have low power consumption, and have competitive read/write speeds.

For an MRAM device, the stability of the nonvolatile memory state, the repeatability of the read/write cycles, and the memory element-to-element switching field uniformity are three of the most important aspects of its design characteristics. A memory state in MRAM is not maintained by power, but rather by the direction of the magnetic moment vector. Storing data is accomplished by applying magnetic fields and causing a magnetic material in a MRAM device to be magnetized into either of two possible memory states. Recalling data is accomplished by sensing the resistive differences in the MRAM device between the two states. The magnetic fields for writing are created by passing currents through strip lines external to the magnetic structure or through the magnetic structures themselves.

As the lateral dimension of an MRAM device decreases, three problems occur. First, the switching field increases for a given shape and film thickness, requiring a larger magnetic field to switch. Second, the total switching volume is reduced so that the energy barrier for reversal decreases. The energy barrier refers to the amount of energy needed to switch the magnetic moment vector from one state to the other. The energy barrier determines the data retention and error rate of the MRAM device and unintended reversals can occur due to thermofluctuations (superparamagnetism) if the barrier is too small. A major problem with having a small energy barrier is that it becomes extremely difficult to selectively switch one MRAM device in an array. Selectability allows switching without inadvertently switching other MRAM devices. Finally, because the switching field is produced by shape, the switching field becomes more sensitive to shape variations as the MRAM device decreases in size. With photolithography scaling becoming more difficult at smaller dimensions, MRAM devices will have difficulty maintaining tight switching distributions.

It would be highly advantageous, therefore, to remedy the foregoing and other deficiencies inherent in the prior art.

Accordingly, it is an object of the present invention to provide a new and improved method of writing to a magnetoresistive random access memory device.

It is an object of the present invention to provide a new and improved method of writing to a magnetoresistive random access memory device which is highly selectable.

It is another object of the present invention to provide a new and improved method of writing to a magnetoresistive random access memory device which has an improved error rate.

It is another object of the present invention to provide a new and improved method of writing to a magnetoresistive random access memory device which has a switching field that is less dependant on shape.

SUMMARY OF THE INVENTION

To achieve the objects and advantages specified above and others, a method of writing to a scalable magnetoresistive memory array is disclosed. The memory array includes a number of scalable magnetoresistive memory devices. For simplicity, we will look at how the writing method applies to a single MRAM device, but it will be understood that the writing method applies to any number of MRAM devices.

The MRAM device used to illustrate the writing method includes a word line and a digit line positioned adjacent to a magnetoresistive memory element. The magnetoresistive memory element includes a pinned magnetic region positioned adjacent to the digit line. A tunneling barrier is positioned on the pinned magnetic region. A free magnetic region is then positioned on the tunneling barrier and adjacent to the word line. In the preferred embodiment, the pinned magnetic region has a resultant magnetic moment vector that is fixed in a preferred direction. Also, in the preferred embodiment, the free magnetic region includes synthetic anti-ferromagnetic (hereinafter referred to as "SAF") layer material. The synthetic anti-ferromagnetic layer material includes N anti-ferromagnetically coupled layers of a ferromagnetic material, where N is a whole number greater than or equal to two. The N layers define a magnetic switching volume that can be adjusted by changing N. In the preferred embodiment, the N ferromagnetic layers are anti-ferromagnetically coupled by sandwiching an anti-ferromagnetic coupling spacer layer between each adjacent ferromagnetic layer. Further, each N layer has a moment adjusted to provide an optimized writing mode.

In the preferred embodiment, N is equal to two so that the synthetic anti-ferromagnetic layer material is a tri-layer structure of a ferromagnetic layer/anti-ferromagnetic coupling spacer layer/ferromagnetic layer. The two ferromagnetic layers in the tri-layer structure have magnetic moment vectors $M_1$ and $M_2$, respectively, and the magnetic moment vectors are usually oriented anti-parallel by the coupling of the anti-ferromagnetic coupling spacer layer. Anti-ferromagnetic coupling is also generated by the magnetostatic fields of the layers in the MRAM structure. Therefore, the spacer layer need not necessarily provide any additional antiferromagnetic coupling beyond eliminating the ferromagnetic coupling between the two magnetic layers. More information as to the MRAM device used to illustrate the writing method can be found in a copending U.S. Patent Application entitled "Magnetoresistance Random Access Memory for Improved Scalability" filed of even date herewith, and incorporated herein by reference.

The magnetic moment vectors in the two ferromagnetic layers in the MRAM device can have different thicknesses or material to provide a resultant magnetic moment vector given by $\Delta M=(M_2-M_1)$ and a sub-layer moment fractional balance ratio, $$M_{br} = \frac{(M_2 - M_1)}{(M_2 + M_1)} = \frac{\Delta M}{M_{total}}.$$

The resultant magnetic moment vector of the tri-layer structure is free to rotate with an applied magnetic field. In zero field the resultant magnetic moment vector will be stable in a direction, determined by the magnetic anisotropy, that is either parallel or anti-parallel with respect to the resultant magnetic moment vector of the pinned reference layer. It will be understood that the term "resultant magnetic moment vector" is used only for purposes of this description and for the case of totally balanced moments, the resultant magnetic moment vector can be zero in the absence of a magnetic field. As described below, only the sub-layer magnetic moment vectors adjacent to the tunnel barrier determine the state of the memory.

The current through the MRAM device depends on the tunneling magnetoresistance, which is governed by the relative orientation of the magnetic moment vectors of the free and pinned layers directly adjacent to the tunneling barrier. If the magnetic moment vectors are parallel, then the MRAM device resistance is low and a voltage bias will induce a larger current through the device. This state is defined as a "1". If the magnetic moment vectors are anti-parallel, then the MRAM device resistance is high and an applied voltage bias will induce a smaller current through the device. This state is defined as a "0". It will be understood that these definitions are arbitrary and could be reversed, but are used in this example for illustrative purposes. Thus, in magnetoresistive memory, data storage is accomplished by applying magnetic fields that cause the magnetic moment vectors in the MRAM device to be orientated either one of parallel and anti-parallel directions relative to the magnetic moment vector in the pinned reference layer.

The method of writing to the scalable MRAM device relies on the phenomenon of "spin-flop" for a nearly balanced SAF tri-layer structure. Here, the term "nearly balanced" is defined such that the magnitude of the sub-layer moment fractional balance ratio is in the range $0 \leq |M_{br}| \leq 0.1$. The spin-flop phenomenon lowers the total magnetic energy in an applied field by rotating the magnetic moment vectors of the ferromagnetic layers so that they are nominally orthogonal to the applied field direction but still predominantly anti-parallel to one another. The rotation, or flop, combined with a small deflection of each ferromagnetic magnetic moment vector in the direction of the applied field accounts for the decrease in total magnetic energy.

In general, using the flop phenomenon and a timed pulse sequence, the MRAM device can be written to using two distinct modes; a direct write mode or a toggle write mode. These modes are achieved using the same timed pulse sequence as will be described, but differ in the choice of magnetic sub-layer moment and polarity and magnitude of the magnetic field applied.

Each writing method has its advantages. For example, when using the direct write mode, there is no need to determine the initial state of the MRAM device because the state is only switched if the state being written is different from the state that is stored. Although the direct writing method does not require knowledge of the state of the MRAM device before the writing sequence is initiated, it does require changing the polarity of both the word and digit line depending on which state is desired.

When using the toggle writing method, there is a need to determine the initial state of the MRAM device before writing because the state will be switched every time the same polarity pulse sequence is generated from both the word and digit lines. Thus, the toggle write mode works by reading the stored memory state and comparing that state with the new state to be written. After comparison, the MRAM device is only written to if the stored state and the new state are different.

The MRAM device is constructed such that the magnetic anisotropy axis is ideally at a 45° angle to the word and digit lines. Hence, the magnetic moment vectors $M_1$ and $M_2$ are oriented in a preferred direction at a 45° angle to the directions of the word line and digit line at a time $t_0$. As an example of the writing method, to switch the state of the MRAM device using either a direct or toggle write, the following current pulse sequence is used. At a time $t_1$, the word current is increased and $M_1$ and $M_2$ begin to rotate either clockwise or counterclockwise, depending on the direction of the word current, to align themselves nominally orthogonal to the field direction due to the spin-flop effect. At a time $t_2$, the digit current is switched on. The digit current flows in a direction such that $M_1$ and $M_2$ are further rotated in the same direction as the rotation caused by the digit line magnetic field. At this point in time, both the word line current and the digit line current are on, with $M_1$ and $M_2$ being nominally orthogonal to the net magnetic field direction, which is 45° with respect to the current lines.

It is important to realize that when only one current is on, the magnetic field will cause $M_1$ and $M_2$ to align nominally in a direction parallel to either the word line or digit line. However, if both currents are on, then $M_1$ and $M_2$ will align nominally orthogonal to a 45° angle to the word line and digit line.

At a time $t_3$, the word line current is switched off, so that $M_1$ and $M_2$ are being rotated only by the digit line magnetic field. At this point, $M_1$ and $M_2$ have generally been rotated past their hard-axis instability points. At a time $t_4$, the digit line current is switched off and $M_1$ and $M_2$ will align along the preferred anisotropy axis. At this point in time, $M_1$ and $M_2$ have been rotated 180° and the MRAM device has been switched. Thus, by sequentially switching the word and digit currents on and off, $M_1$ and $M_2$ of the MRAM device can be rotated by 180° so that the state of the device is switched.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 4 is a graph illustrating the timing diagram of the word current and the digit current when both are turned on;

FIG. 9 is a graph illustrating the timing diagram of the word current and the digit current when only the digit current is turned on; and FIG. 10 is a graph illustrating the rotation of the magnetic moment vectors for a magnetoresistive random access memory device when only the digit current is turned on.

DETAILED DESCRIPTION OF THE PREFERRED EMBODIMENT

Figure 1:
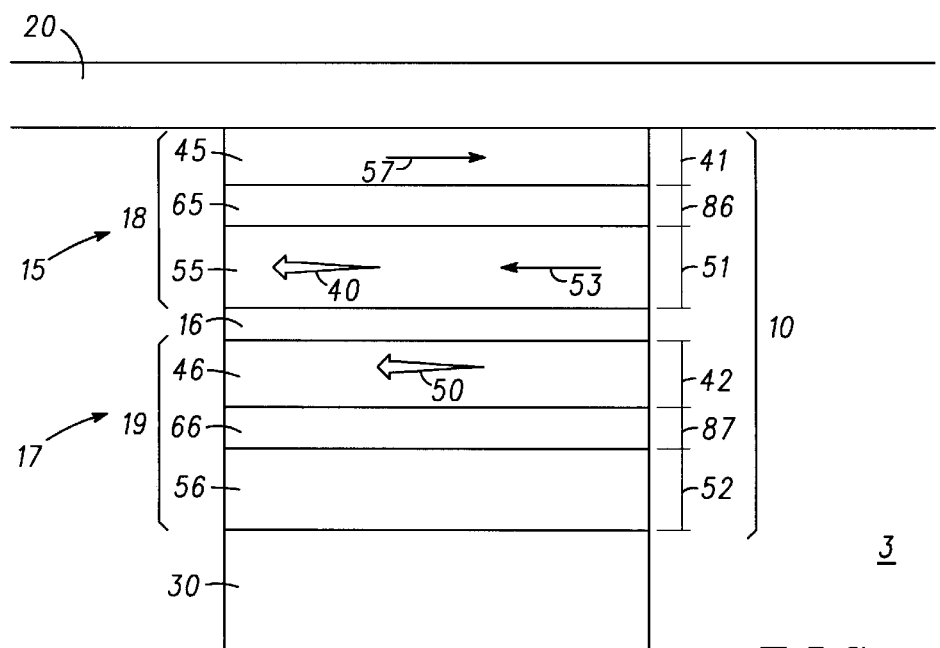
FIG. 1 is a simplified sectional view of a magnetoresistive random access memory device.

Turn now to FIG. 1, which illustrates a simplified sectional view of an MRAM array 3 in accordance with the present invention. In this illustration, only a single magnetoresistive memory device 10 is shown, but it will be understood that MRAM array 3 consists of a number of MRAM devices 10 and we are showing only one such device for simplicity in describing the writing method.

MRAM device 10 is sandwiched therebetween a word line 20 and a digit line 30. Word line 20 and digit line 30 include conductive material such that a current can be passed therethrough. In this illustration, word line 20 is positioned on top of MRAM device 10 and digit line 30 is positioned on the bottom of MRAM device 10 and is directed at a 90° angle to word line 20 (See FIG. 2).

MRAM device 10 includes a first magnetic region 15, a tunneling barrier 16, and a second magnetic region 17, wherein tunneling barrier 16 is sandwiched therebetween first magnetic region 15 and second magnetic region 17. In the preferred embodiment, magnetic region 15 includes a tri-layer structure 18, which has an anti-ferromagnetic coupling spacer layer 65 sandwiched therebetween two ferromagnetic layers 45 and 55. Anti-ferromagnetic coupling spacer layer 65 has a thickness 86 and ferromagnetic layers 45 and 55 have thicknesses 41 and 51, respectively. Further, magnetic region 17 has a tri-layer structure 19, which has an anti-ferromagnetic coupling spacer layer 66 sandwiched therebetween two ferromagnetic layers 46 and 56. Anti-ferromagnetic coupling spacer layer 66 has a thickness 87 and ferromagnetic layers 46 and 56 have thicknesses 42 and 52, respectively.

Generally, anti-ferromagnetic coupling spacer layers 65 and 66 include at least one of the elements Ru, Os, Re, Cr, Rh, Cu, or combinations thereof. Further, ferromagnetic layers 45, 55, 46, and 56 include at least one of elements Ni, Fe, Mn, Co, or combinations thereof. Also, it will be understood that magnetic regions 15 and 17 can include synthetic anti-ferromagnetic layer material structures other than tri-layer structures and the use of tri-layer structures in this embodiment is for illustrative purposes only. For example, one such synthetic anti-ferromagnetic layer material structure could include a five-layer stack of a ferromagnetic layer/anti-ferromagnetic coupling spacer layer/ferromagnetic layer/anti-ferromagnetic coupling spacer layer/ferromagnetic layer structure.

Ferromagnetic layers 45 and 55 each have a magnetic moment vector 57 and 53, respectively, that are usually held anti-parallel by coupling of the anti-ferromagnetic coupling spacer layer 65. Also, magnetic region 15 has a resultant magnetic moment vector 40 and magnetic region 17 has a resultant magnetic moment vector 50. Resultant magnetic moment vectors 40 and 50 are oriented along an anisotropy easy-axis in a direction that is at an angle, preferably 45°, from word line 20 and digit line 30 (See FIG. 2). Further, magnetic region 15 is a free ferromagnetic region, meaning that resultant magnetic moment vector 40 is free to rotate in the presence of an applied magnetic field. Magnetic region 17 is a pinned ferromagnetic region, meaning that resultant magnetic moment vector 50 is not free to rotate in the presence of a moderate applied magnetic field and is used as the reference layer.

While anti-ferromagnetic coupling layers are illustrated between the two ferromagnetic layers in each tri-layer structure 18, it will be understood that the ferromagnetic layers could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

In the preferred embodiment, MRAM device 10 has tri-layer structures 18 that have a length/width ratio in a range of 1 to 5 for a non-circular plan. However, we illustrate a plan that is circular (See FIG. 2). MRAM device 10 is circular in shape in the preferred embodiment to minimize the contribution to the switching field from shape anisotropy and also because it is easier to use photolithographic processing to scale the device to smaller dimensions laterally. However, it will be understood that MRAM device 10 can have other shapes, such as square, elliptical, rectangular, or diamond, but is illustrated as being circular for simplicity and improved performance.

Further, during fabrication of MRAM array 3, each succeeding layer (i.e. 30, 55, 65, etc.) is deposited or otherwise formed in sequence and each MRAM device 10 may be defined by selective deposition, photolithography processing, etching, etc. in any of the techniques known in the semiconductor industry. During deposition of at least the ferromagnetic layers 45 and 55, a magnetic field is provided to set a preferred easy magnetic axis for this pair (induced anisotropy). The provided magnetic field creates a preferred anisotropy axis for magnetic moment vectors 53 and 57. The preferred axis is chosen to be at a 45° angle between word line 20 and digit line 30, as will be discussed presently.

Figure 2:
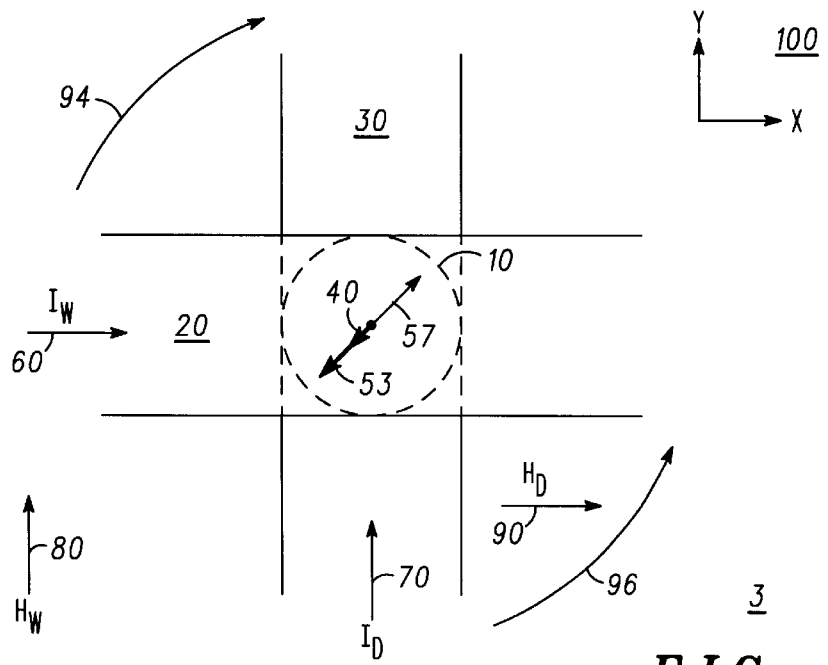
FIG. 2 is a simplified plan view of a magnetoresistive random access memory device with word and digit lines.

Turn now to FIG. 2, which illustrates a simplified plan view of a MRAM array 3 in accordance with the present invention. To simplify the description of MRAM device 10, all directions will be referenced to an x- and y-coordinate system 100 as shown and to a clockwise rotation direction 94 and a counter-clockwise rotation direction 96. To further simplify the description, it is again assumed that N is equal to two so that MRAM device 10 includes one tri-layer structure in region 15 with magnetic moment vectors 53 and 57, as well as resultant magnetic moment vector 40. Also, only the magnetic moment vectors of region 15 are illustrated since they will be switched.

To illustrate how the writing methods work, it is assumed that a preferred anisotropy axis for magnetic moment vectors 53 and 57 is directed at a 45° angle relative to the negative x- and negative y-directions and at a 45° angle relative to the positive x- and positive y-directions. As an example, FIG. 2 shows that magnetic moment vector 53 is directed at a 45° angle relative to the negative x- and negative y-directions. Since magnetic moment vector 57 is generally oriented anti-parallel to magnetic moment vector 53, it is directed at a 45° angle relative to the positive x- and positive y-directions. This initial orientation will be used to show examples of the writing methods, as will be discussed presently.

In the preferred embodiment, a word current 60 is defined as being positive if flowing in a positive x-direction and a digit current 70 is defined as being positive if flowing in a positive y-direction. The purpose of word line 20 and digit line 30 is to create a magnetic field within MRAM device 10. A positive word current 60 will induce a circumferential word magnetic field, $H_W$ 80, and a positive digit current 70 will induce a circumferential digit magnetic field, $H_D$ 90. Since word line 20 is above MRAM device 10, in the plane of the element, $H_W$ 80 will be applied to MRAM device 10 in the positive y-direction for a positive word current 60. Similarly, since digit line 30 is below MRAM device 10, in the plane of the element, $H_D$ 90 will be applied to MRAM device 10 in the positive x-direction for a positive digit current 70. It will be understood that the definitions for positive and negative current flow are arbitrary and are defined here for illustrative purposes. The effect of reversing the current flow is to change the direction of the magnetic field induced within MRAM device 10. The behavior of a current induced magnetic field is well known to those skilled in the art and will not be elaborated upon further here.

Figure 3:
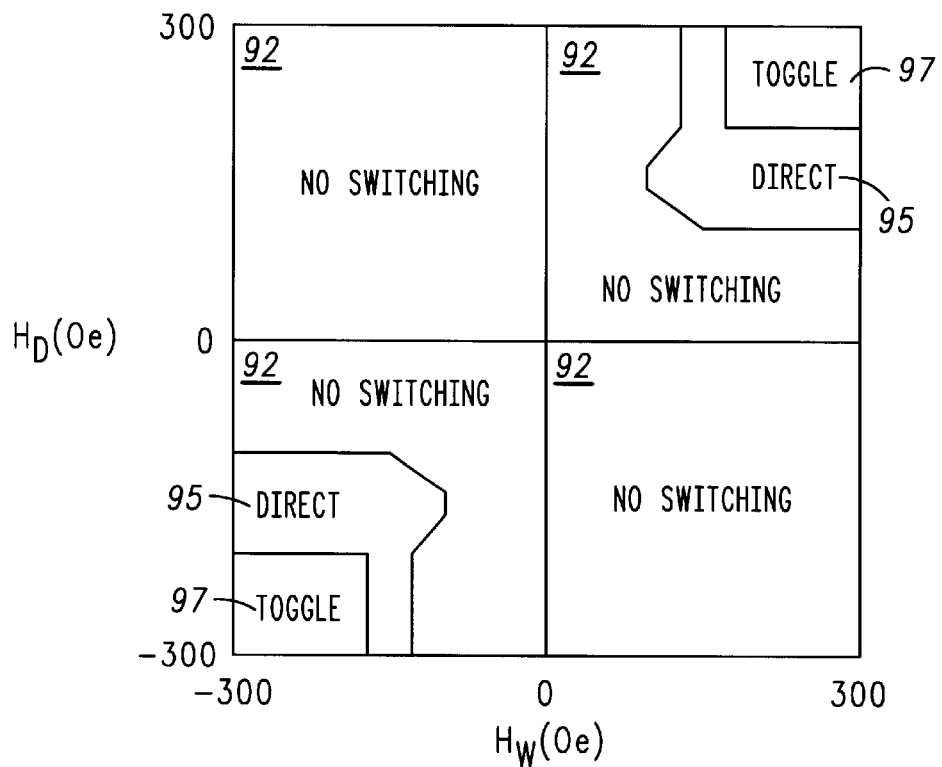
FIG. 3 is a graph illustrating a simulation of the magnetic field amplitude combinations that produce the direct or toggle write mode in the magnetoresistive random access memory device.
Figure 4:
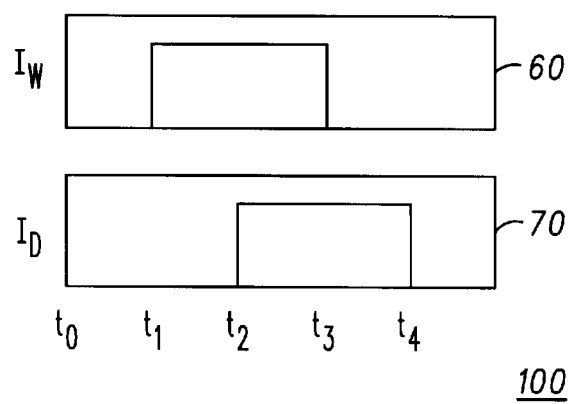

Turn now to FIG. 3, which illustrates the simulated switching behavior of a SAF tri-layer structure. The simulation consists of two single domain magnetic layers that have close to the same moment (a nearly balanced SAF) with an intrinsic anisotropy, are coupled anti-ferromagnetically, and whose magnetization dynamics are described by the Landau-Lifshitz equation. The x-axis is the word line magnetic field amplitude in Oersteds, and the y-axis is the digit line magnetic field amplitude in Oersteds. The magnetic fields are applied in a pulse sequence 100 as shown in FIG. 4 wherein pulse sequence 100 includes word current 60 and digit current 70 as functions of time.

There are three regions of operation illustrated in FIG. 3. In a region 92 there is no switching. For MRAM operation in a region 95, the direct writing method is in effect. When using the direct writing method, there is no need to determine the initial state of the MRAM device because the state is only switched if the state being written is different from the state that is stored. The selection of the written state is determined by the direction of current in both word line 20 and digit line 30. For example, if a '1' is desired to be written, then the direction of current in both lines will be positive. If a '1' is already stored in the element and a '1' is being written, then the final state of the MRAM device will continue to be a '1'. Further, if a '0' is stored and a '1' is being written with positive currents, then the final state of the MRAM device will be a '1'. Similar results are obtained when writing a '0' by using negative currents in both the word and digit lines. Hence, either state can be programmed to the desired '1' or '0' with the appropriate polarity of current pulses, regardless of its initial state. Throughout this disclosure, operation in region 95 will be defined as "direct write mode".

For MRAM operation in a region 97, the toggle writing method is in effect. When using the toggle writing method, there is a need to determine the initial state of the MRAM device before writing because the state is switched every time the MRAM device is written to, regardless of the direction of the currents as long as the same polarity current pulses are chosen for both word line 20 and digit line 30. For example, if a '1' is initially stored then the state of the device will be switched to a '0' after one positive current pulse sequence is flowed through the word and digit lines. Repeating the positive current pulse sequence on the stored '0' state returns it to a '1'. Thus, to be able to write the memory element into the desired state, the initial state of MRAM device 10 must first be read and compared to the state to be written. The reading and comparing may require additional logic circuitry, including a buffer for storing information and a comparator for comparing memory states. MRAM device 10 is then written to only if the stored state and the state to be written are different. One of the advantages of this method is that the power consumed is lowered because only the differing bits are switched. An additional advantage of using the toggle writing method is that only uni-polar voltages are required and, consequently, smaller N-channel transistors can be used to drive the MRAM device. Throughout this disclosure, operation in region 97 will be defined as "toggle write mode".

Both writing methods involve supplying currents in word line 20 and digit line 30 such that magnetic moment vectors 53 and 57 can be oriented in one of two preferred directions as discussed previously. To fully elucidate the two switching modes, specific examples describing the time evolution of magnetic moment vectors 53, 57, and 40 are now given.

Figure 5:
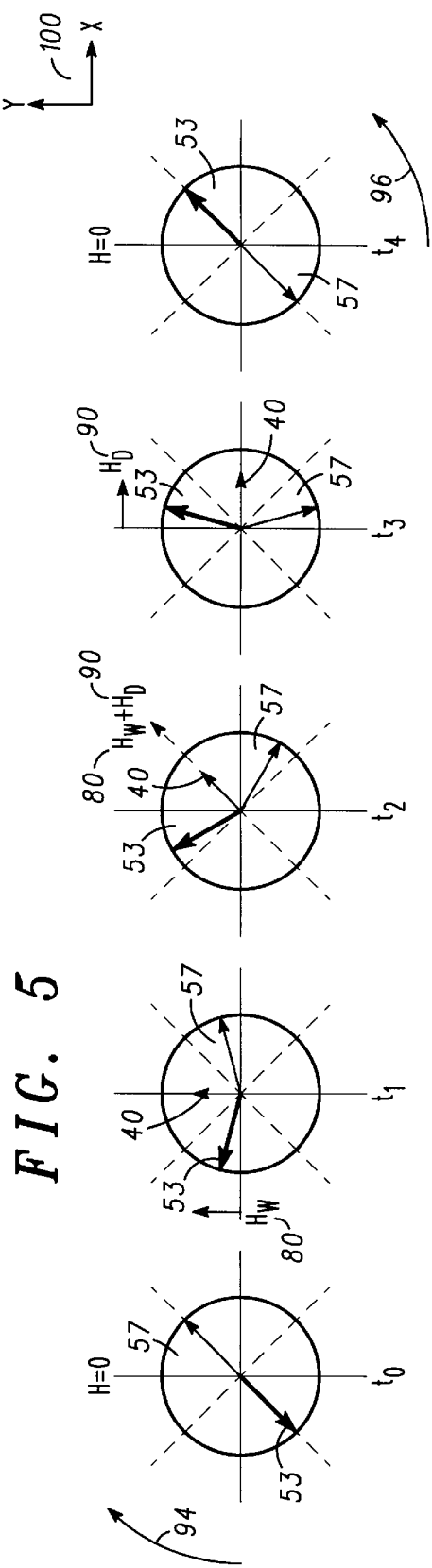
FIG. 5 is a diagram illustrating the rotation of the magnetic moment vectors for a magnetoresistive random access memory device for the toggle write mode when writing a '1' to a '0'.

Turn now to FIG. 5 which illustrates the toggle write mode for writing a '1' to a '0' using pulse sequence 100. In this illustration at time $t_0$, magnetic moment vectors 53 and 57 are oriented in the preferred directions as shown in FIG. 2. This orientation will be defined as a '1'.

At a time $t_1$, a positive word current 60 is turned on, which induces $H_W$ 80 to be directed in the positive y-direction. The effect of positive $H_W$ 80 is to cause the nearly balanced anti-aligned MRAM tri-layer to "FLOP" and become oriented approximately 90° to the applied field direction. The finite anti-ferromagnetic exchange interaction between ferromagnetic layers 45 and 55 will allow magnetic moment vectors 53 and 57 to now deflect at a small angle toward the magnetic field direction and resultant magnetic moment vector 40 will subtend the angle between magnetic moment vectors 53 and 57 and will align with $H_W$ 80. Hence, magnetic moment vector 53 is rotated in clockwise direction 94. Since resultant magnetic moment vector 40 is the vector addition of magnetic moment vectors 53 and 57, magnetic moment vector 57 is also rotated in clockwise direction 94.

At a time $t_2$, positive digit current 70 is turned on, which induces positive $H_D$ 90. Consequently, resultant magnetic moment vector 40 is being simultaneously directed in the positive y-direction by $H_W$ 80 and the positive x-direction by $H_D$ 90, which has the effect of causing effective magnetic moment vector 40 to further rotate in clockwise direction 94 until it is generally oriented at a 45° angle between the positive x- and positive y-directions. Consequently, magnetic moment vectors 53 and 57 will also further rotate in clockwise direction 94.

At a time $t_3$, word current 60 is turned off so that now only $H_D$ 90 is directing resultant magnetic moment vector 40, which will now be oriented in the positive x-direction. Both magnetic moment vectors 53 and 57 will now generally be directed at angles passed their anisotropy hard-axis instability points.

At a time $t_4$, digit current 70 is turned off so a magnetic field force is not acting upon resultant magnetic moment vector 40. Consequently, magnetic moment vectors 53 and 57 will become oriented in their nearest preferred directions to minimize the anisotropy energy. In this case, the preferred direction for magnetic moment vector 53 is at a 45° angle relative to the positive y- and positive x-directions. This preferred direction is also 180° from the initial direction of magnetic moment vector 53 at time $t_0$ and is defined as '0'. Hence, MRAM device 10 has been switched to a '0'. It will be understood that MRAM device 10 could also be switched by rotating magnetic moment vectors 53, 57, and 40 in counter clockwise direction 96 by using negative currents in both word line 20 and digit line 30, but is shown otherwise for illustrative purposes.

Figure 6:
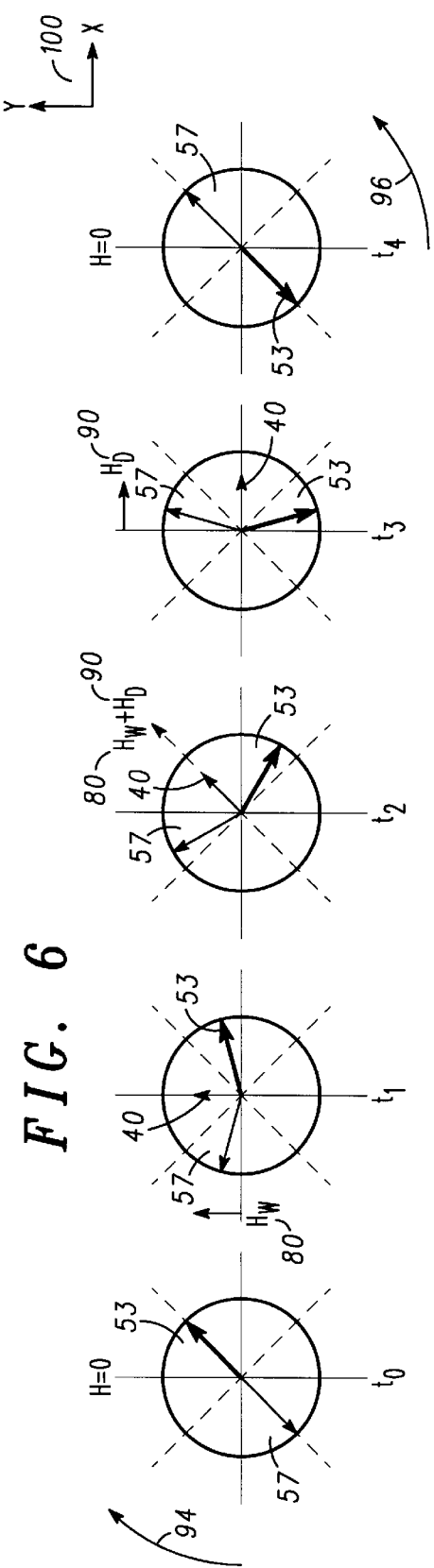
FIG. 6 is a diagram illustrating the rotation of the magnetic moment vectors for a magnetoresistive random access memory device for the toggle write mode when writing a '0' to a '1'.

Turn now to FIG. 6 which illustrates the toggle write mode for writing a '0' to a '1' using pulse sequence 100. Illustrated are the magnetic moment vectors 53 and 57, as well as resultant magnetic moment vector 40, at each of the times $t_0$, $t_1$, $t_2$, $t_3$, and $t_4$ as described previously showing the ability to switch the state of MRAM device 10 from '0' to '1' with the same current and magnetic field directions. Hence, the state of MRAM device 10 is written to with toggle write mode, which corresponds to region 97 in FIG. 3.

For the direct write mode, it is assumed that magnetic moment vector 53 is larger in magnitude than magnetic moment vector 57, so that magnetic moment vector 40 points in the same direction as magnetic moment vector 53, but has a smaller magnitude in zero field. This unbalanced moment allows the dipole energy, which tends to align the total moment with the applied field, to break the symmetry of the nearly balanced SAF. Hence, switching can occur only in one direction for a given polarity of current.

Figure 7:
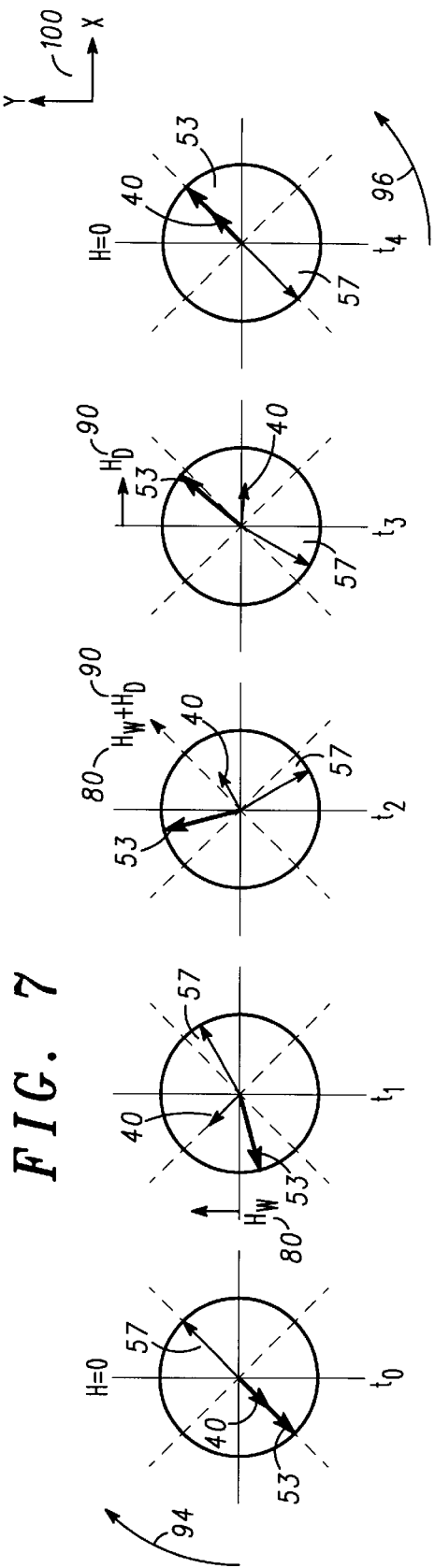
FIG. 7 is a graph illustrating the rotation of the magnetic moment vectors for a magnetoresistive random access memory device for the direct write mode when writing a '1' to a '0'.

Turn now to FIG. 7 which illustrates an example of writing a '1' to a '0' using the direct write mode using pulse sequence 100. Here again, the memory state is initially a '1' with magnetic moment vector 53 directed 45° with respect to the negative x- and negative y-directions and magnetic moment vector 57 directed 45° with respect to the positive x- and positive y-directions. Following the pulse sequence as described above with positive word current 60 and positive digit current 70, the writing occurs in a similar manner as the toggle write mode as described previously. Note that the moments again 'FLOP' at a time $t_1$, but the resulting angle is canted from 90° due to the unbalanced moment and anisotropy. After time $t_4$, MRAM device 10 has been switched to the '0' state with resultant magnetic moment 40 oriented at a 45° angle in the positive x- and positive y-directions as desired. Similar results are obtained when writing a '0' to a '1' only now with negative word current 60 and negative digit current 70.

Figure 8:
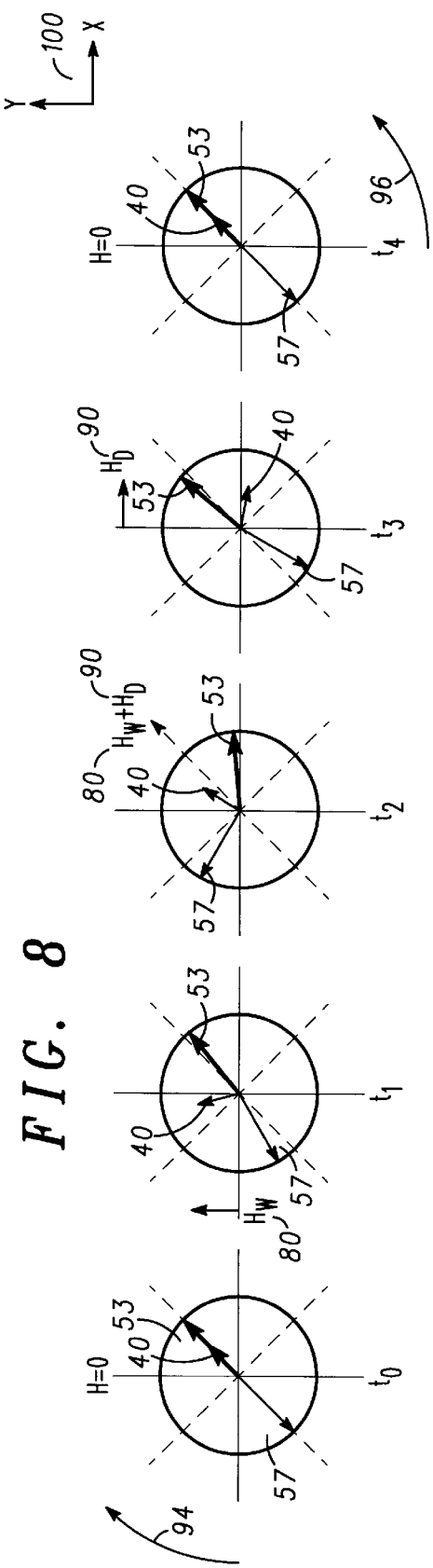
FIG. 8 is a graph illustrating the rotation of the magnetic moment vectors for a magnetoresistive random access memory device for the direct write mode when writing a '0' to a state that is already a '0'.

Turn now to FIG. 8 which illustrates an example of writing using the direct write mode when the new state is the same as the state already stored. In this example, a '0' is already stored in MRAM device 10 and current pulse sequence 100 is now repeated to store a '0'. Magnetic moment vectors 53 and 57 attempt to "FLOP" at a time $t_1$, but because the unbalanced magnetic moment must work against the applied magnetic field, the rotation is diminished. Hence, there is an additional energy barrier to rotate out of the reverse state. At time $t_2$, the dominant moment 53 is nearly aligned with the positive x-axis and less than 45° from its initial anisotropy direction. At a time $t_3$, the magnetic field is directed along the positive x-axis. Rather than rotating further clockwise, the system now lowers its energy by changing the SAF moment symmetry with respect to the applied field. The passive moment 57 crosses the x-axis and the system stabilizes with the dominant moment 53 returned to near its original direction. Therefore, at a time $t_4$ when the magnetic field is removed, and the state stored in MRAM device 10 will remain a '0'. This sequence illustrates the mechanism of the direct write mode shown as region 95 in FIG. 3. Hence, in this convention, to write a '0' requires positive current in both word line 60 and digit line 70 and, conversely, to write a '1' negative current is required in both word line 60 and digit line 70.

If larger fields are applied, eventually the energy decrease associated with a flop and scissor exceeds the additional energy barrier created by the dipole energy of the unbalanced moment which is preventing a toggle event. At this point, a toggle event will occur and the switching is described by region 97.

Region 95 in which the direct write mode applies can be expanded, i.e. toggle mode region 97 can be moved to higher magnetic fields, if the times $t_3$ and $t_4$ are equal or made as close to equal as possible. In this case, the magnetic field direction starts at 45° relative to the bit anisotropy axis when word current 60 turns on and then moves to parallel with the bit anisotropy axis when digit current 70 turns on. This example is similar to the typical magnetic field application sequence. However, now word current 60 and digit current 70 turn off substantially simultaneously, so that the magnetic field direction does not rotate any further. Therefore, the applied field must be large enough so that the resultant magnetic moment vector 40 has already moved past its hard-axis instability point with both word current 60 and digit current 70 turned on. A toggle writing mode event is now less likely to occur, since the magnetic field direction is now rotated only 45°, instead of 90° as before. An advantage of having substantially coincident fall times, $t_3$ and $t_4$, is that now there are no additional restrictions on the order of the field rise times $t_1$ and $t_2$. Thus, the magnetic fields can be turned on in any order or can also be substantially coincident.

Figure 9:
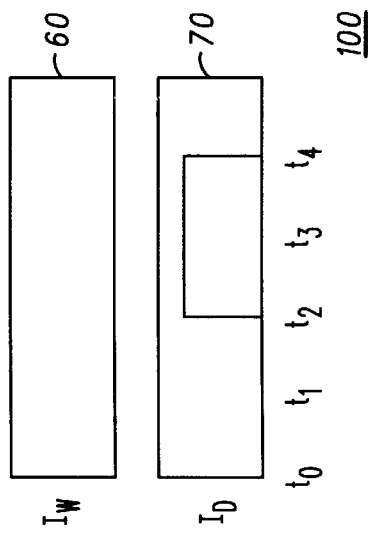
Figure 10:
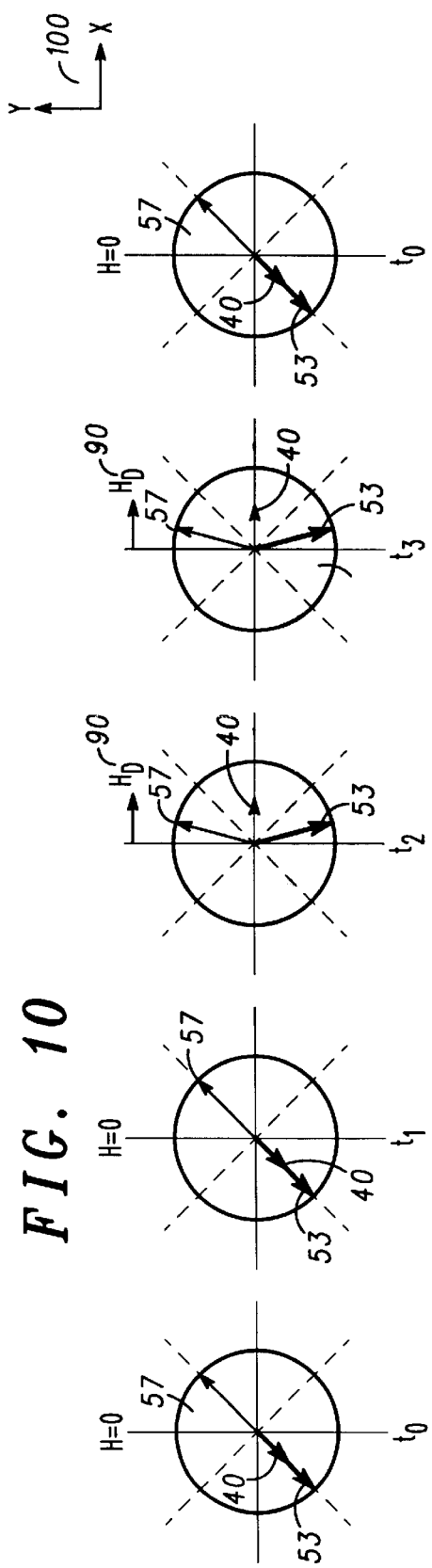

The writing methods described previously are highly selective because only the MRAM device that has both word current 60 and digit current 70 turned on between time $t_2$ and time $t_3$ will switch states. This feature is illustrated in FIGS. 9 and 10. FIG. 9 illustrates pulse sequence 100 when word current 60 is not turned on and digit current 70 is turned on. FIG. 10 illustrates the corresponding behavior of the state of MRAM device 10. At a time $t_0$, magnetic moment vectors 53 and 57, as well as resultant magnetic moment vector 40, are oriented as described in FIG. 2. In pulse sequence 100, digit current 70 is turned on at a time $t_1$. During this time, $H_D$ 90 will cause resultant magnetic moment vector 40 to be directed in the positive x-direction.

Since word current 60 is never switched on, resultant magnetic moment vectors 53 and 57 are never rotated through their anisotropy hard-axis instability points. As a result, magnetic moment vectors 53 and 57 will reorient themselves in the nearest preferred direction when digit current 70 is turned of f at a time $t_3$ which in this case is the initial direction at time $t_0$. Hence, the state of MRAM device 10 is not switched. It will be understood that the same result will occur if word current 60 is turned on at similar times described above and digit current 70 is not turned on. This feature ensures that only one MRAM device in an array will be switched, while the other devices will remain in their initial states. As a result, unintentional switching is avoided and the bit error rate is minimized.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A method of switching a magnetoresistive memory device comprising the steps of:
   providing a magnetoresistive memory element adjacent to a first conductor and a second conductor wherein the magnetoresistive memory element includes a pinned magnetic region and a free magnetic region separated by a tunneling barrier, the free magnetic region includes N anti-ferromagnetically coupled layers of a ferromagnetic material, where N is an integer greater than or equal to two, and where the N layers define a volume and each layer of the N layers has a moment adjusted to provide a writing mode, and wherein a sub-layer magnetic moment fractional balance ratio of the one of the first and second magnetic regions is in a range $0 \leq |M_{br}| \leq 0.1$, and the free magnetic region has a magnetic moment vector adjacent to the tunneling barrier oriented in a preferred direction at a time $t_0$; and
   applying a word current pulse to one of the first and second conductors at a time $t_1$ and turning off the word current pulse at a time $t_3$ while additionally applying a digit line current pulse to another of the first and second conductors at a time $t_2$ and turning off the digit line current pulse at a time $t_4$, wherein $t_0<t_1<t_2<t_3<t_4$ so that the magnetic moment vector of the free magnetic region adjacent to the tunneling barrier at the time $t_4$ is oriented in a direction different from the initial preferred direction at the time $t_0$.

2. The method of switching a magnetoresistive memory device as claimed in claim 1 wherein the step of providing the magnetoresistive memory element includes adjusting the magnetic moment of each layer of the N layers to provide a direct write mode at an operating current such that the current in each of the first and second conductors is pulsed with a same polarity to write a state and the current in each of the first and second conductors is pulsed with an opposite polarity to reverse the state.

3. The method of switching a magnetoresistive memory device as claimed in claim 2 wherein the time $t_3$ is approximately equal to $t_4$ so that the magnetoresistive memory device operates in the direct write mode at the operating current.

4. The method of switching a magnetoresistive memory device as claimed in claim 3 wherein the time $t_1$ is approximately equal to $t_2$ so that the magnetoresistive memory device operates in the direct write mode at the operating current.

5. The method of switching a magnetoresistive memory device as claimed in claim 1 including in addition steps of reading the magnetoresistive memory device to obtain stored information and comparing the stored information to program information to be written prior to the steps of turning on and turning off at least one of the word current pulses and digit line current pulses.

6. The method of switching a magnetoresistive memory device as claimed in claim 1 including in addition steps of providing the word current pulses and digit line current pulses by using unipolar direction currents.

7. The method of switching a magnetoresistive memory device as claimed in claim 1 wherein the step of providing the magnetoresistive memory element includes adjusting the moment of each layer of the N layers to provide a toggle write mode at an operating current such that the current in each of the first and second conductors is pulsed with a same polarity to write a state and the current in each of the first and second conductors is pulsed with the same polarity to reverse the state.

8. The method of switching a magnetoresistive memory device as claimed in claim 7 including in addition steps of reading the magnetoresistive memory device to obtain stored information and comparing the stored information to program information to be written prior to the steps of applying the word current pulse and the digit line current pulse and turning off the word current pulse and the digit line current pulse.

9. The method of switching a magnetoresistive memory device as claimed in claim 7 including in addition the steps of applying the word current pulse and the digit line current pulse by using unipolar direction currents.

10. The method of switching a magnetoresistive memory device as claimed in claim 1 wherein the step of providing the magnetoresistive element including N layers of ferromagnetic material includes a step of separating the N layers by an anti-ferromagnetic coupling material to provide the anti-ferromagnetic coupling.

11. The method of switching a magnetoresistive memory device as claimed in claim 10 wherein the anti-ferromagnetic coupling material has a thickness in a range of approximately 4 Å to 30 Å.

12. The method of switching a magnetoresistive memory device as claimed in claim 10 wherein the step of providing the magnetoresistive memory element includes using one of Ru, Os, Re, Cr, Rh, and Cu in the anti-ferromagnetic coupling material.

13. The method of switching a magnetoresistive memory device as claimed in claim 1 further including a step of orientating the first and second conductors at approximately a 90° angle relative to each other.

14. The method of switching a magnetoresistive memory device as claimed in claim 13 further including a step of setting the preferred direction at the time $t_0$ to be at a non-zero angle to the first and second conductors.

15. The method of switching a magnetoresistive memory device as claimed in claim 1 wherein the step of applying the word current pulse and the digit line current pulse to the first and second conductors, includes using a current magnitude that is large enough to cause the magnetic moment vector of the free magnetic region adjacent to the tunneling barrier to switch to a different direction relative to the orientation at the time $t_0$.

16. The method of switching a magnetoresistive memory device as claimed in claim 1 wherein the step of providing the magnetoresistive memory element includes using one of Ni, Fe, Mn, Co, and combinations thereof, in the layers of ferromagnetic material.

17. The method of switching a magnetoresistive memory device as claimed in claim 16 wherein the step of providing the magnetoresistive memory element includes forming each layer of the N layers with a thickness in a range of approximately 15 Å to 100 Å.

18. The method of switching a magnetoresistive memory device as claimed in claim 1 wherein the step of providing the magnetoresistive memory element includes providing an element with a substantially circular cross section.

19. The method of switching a magnetoresistive memory device as claimed in claim 1 including in addition a step of scaling the volume by increasing N such that the volume remains substantially constant or increases and a sub-layer magnetic moment fractional balance ratio remains constant as the magnetoresistive memory element is scaled laterally to smaller dimensions.

20. The method of switching a magnetoresistive memory device as claimed in claim 1 including in addition a step of adjusting the magnetic moment of the N layers so that a magnetic field needed to switch the magnetic moment vector of the free magnetic region remains substantially constant as the device is scaled laterally to smaller dimensions.

21. A method of switching a magnetoresistive device comprising the steps of:

providing a magnetoresistive device adjacent to a first conductor and a second conductor wherein the magnetoresistive device includes a free magnetic region and a fixed magnetic region separated by a tunneling barrier, the free magnetic region including an N layer synthetic anti-ferromagnetic structure that defines a volume, where N is an integer greater than or equal to two, the N layer synthetic anti-ferromagnetic structure includes anti-ferromagnetically coupled ferromagnetic layers with an magnetic moment vector adjacent the tunneling barrier oriented in a preferred direction at a time $t_0$, and the N layer synthetic anti-ferromagnetic structure is adjusted to provide a toggle write mode;

reading an initial state of the magnetoresistive memory device and comparing the initial state with a new state to be stored in the magnetoresistive memory device; and applying a word current pulse, only if the initial state and the new state to be stored are different, to one of the first and second conductors at a time $t_1$ and turning off the word current pulse at a time $t_3$ while additionally applying a digit line current pulse to another of the first and second conductors at a time $t_2$ and turning off the digit line current pulse at a time $t_4$.

22. The method of switching a magnetoresistive memory device as claimed in claim 21 wherein the magnetic moment vector adjacent to the tunneling barrier is oriented at a different direction at the time $t_4$ relative to the preferred direction at the time $t_0$, and $t_0<t_1<t_2<t_3<t_4$.

23. The method of switching a magnetoresistive memory device as claimed in claim 21 wherein the time $t_3$ is approximately equal to the time $t_4$ so that the magnetoresistive memory device operates in a direct write mode at an operating current.

24. The method of switching a magnetoresistive memory device as claimed in claim 23 wherein the time $t_1$ is approximately equal to the time $t_2$ so that the magnetoresistive memory device operates in the direct write mode at the operating current.

25. The method of switching a magnetoresistive memory device as claimed in claim 21 further including a step of orientating the first and second conductors at approximately a 90° angle relative to each other.

26. The method of switching a magnetoresistive memory device as claimed in claim 21 further including a step of setting the preferred direction at the time $t_0$ to be at a non-zero angle to the first and second conductors.

27. The method of switching a magnetoresistive memory device as claimed in claim 21 wherein the step of applying the word current pulse and the digit line current pulse to the first and second conductors includes using a current magnitude that is large enough to cause the magnetic moment vector of the N layer synthetic anti-ferromagnetic structure to orient in a direction different from the initial preferred direction at the time $t_0$.

28. The method of switching a magnetoresistive memory device as claimed in claim 21 wherein the step of forming the magnetoresistive memory element includes using one of Ru, Os, Re, Cr, Rh, and Cu to provide the anti-ferromagnetic coupling.

29. The method of switching a magnetoresistive memory device as claimed in claim 21 wherein the step of providing the magnetoresistive memory element includes providing an element with a substantially circular cross section.

30. The method of switching a magnetoresistive memory device as claimed in claim 21 including in addition a step of scaling the volume by increasing N such that the volume remains substantially constant or increases and a sub-layer moment fractional balance ratio remains constant as the magnetoresistive memory element is scaled laterally to smaller dimensions.

31. The method of switching a magnetoresistive memory device as claimed in claim 21 including in addition a step of providing the word current pulse and the digit line current pulse by using unipolar direction currents.

* * * * *

UNITED STATES PATENT AND TRADEMARK OFFICE
CERTIFICATE OF CORRECTION

PATENT NO.   : 6,545,906 B1
DATED        : April 8, 2003
INVENTOR(S)  : Savtchenko et al.

It is certified that error appears in the above-identified patent and that said Letters Patent is hereby corrected as shown below:

<u>Column 1,</u>
Line 4, after the Title, please add as a new first paragraph the following paragraph:
      -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*